United States Patent [19]
Ghaem

[11] Patent Number: 5,634,203
[45] Date of Patent: May 27, 1997

[54] ADAPTIVE MULTI-RECEIVER SHARED ANTENNA MATCHING SYSTEM AND METHOD

[75] Inventor: Sanjar Ghaem, Palatine, Ill.

[73] Assignee: Motorola Inc., Schaumburg, Ill.

[21] Appl. No.: 299,981

[22] Filed: Sep. 2, 1994

[51] Int. Cl.$^6$ .................................... H04B 17/02
[52] U.S. Cl. .................... 455/134; 455/80; 455/289; 333/17.3; 333/124
[58] Field of Search .................... 455/132, 133, 455/134–135, 140, 142, 143, 144, 191.1, 193.1, 193.2, 193.3, 227, 269, 280, 281, 289, 290, 291, 292, 136, 81–82; 343/858; 370/38; 333/124, 125, 126, 129

[56] References Cited

U.S. PATENT DOCUMENTS

| | | | |
|---|---|---|---|
| 3,160,833 | 12/1964 | Dunncan et al. | 333/17 |
| 3,473,128 | 10/1969 | Kiser | 455/193.1 |
| 3,996,589 | 12/1976 | Breese | 343/8 |
| 4,268,805 | 5/1981 | Tanner et al. | 333/129 |
| 5,280,636 | 1/1994 | Kelley et al. | 455/131 |

*Primary Examiner*—Reinhard J. Eisenzopf
*Assistant Examiner*—Lee Nguyen
*Attorney, Agent, or Firm*—Nicholas C. Hopman

[57] ABSTRACT

An adaptive multi-receiver shared antenna matching system and corresponding method includes an antenna (101). A plurality receiver devices (103) are operably coupled to the antenna (101). Degree of coupling between each of the receiver devices (103) and the antenna (101) is dynamically alterable dependent on a degree of coupling model (200) and different signals received by the antenna (101).

11 Claims, 3 Drawing Sheets

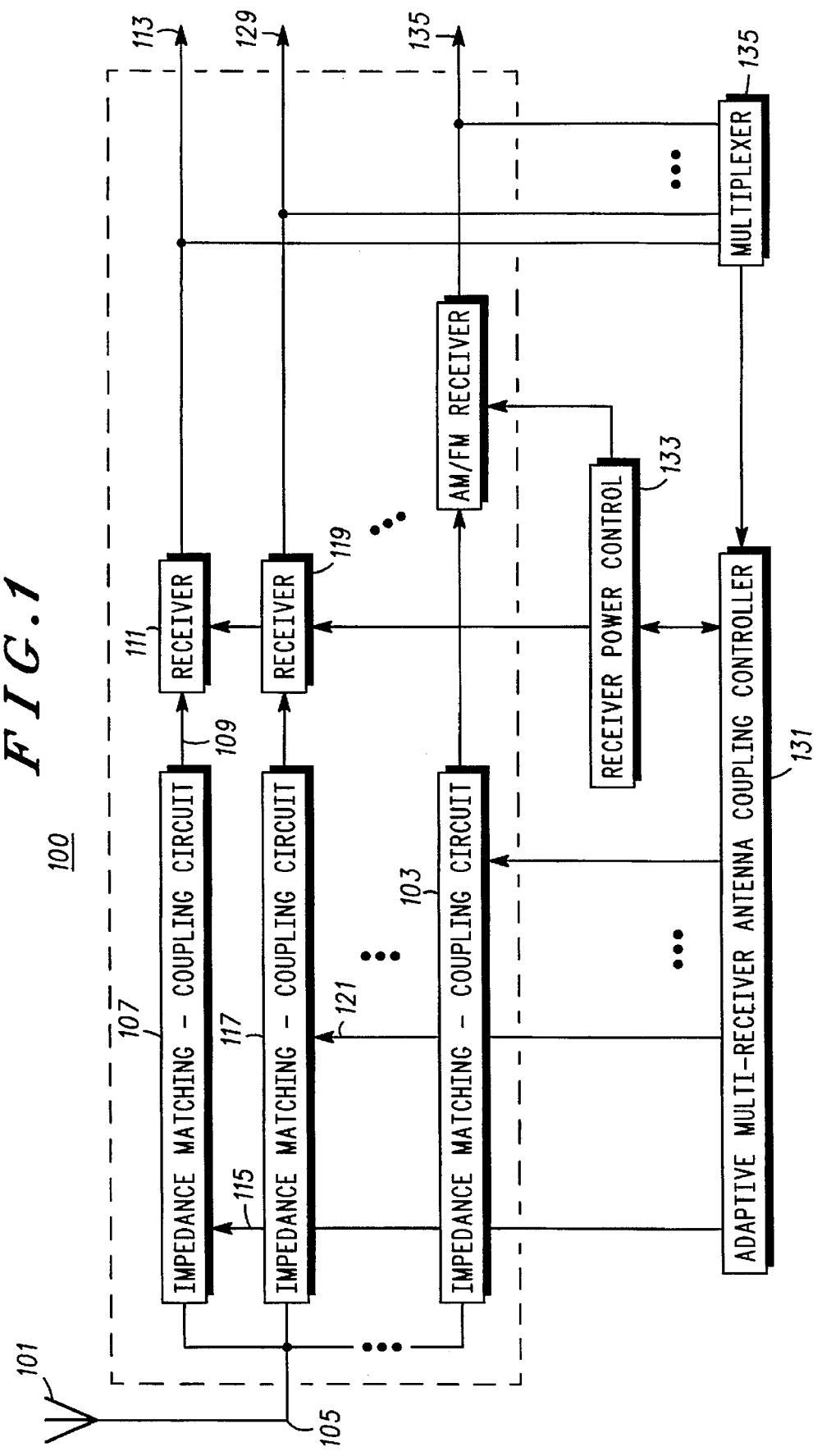

| RECEIVER PRIORITY | STANDBY | RECEIVER A IN USE | RECEIVER B IN USE | RECEIVER C IN USE | RECEIVER D IN USE | RECEIVER E IN USE | RECEIVER F IN USE |
|---|---|---|---|---|---|---|---|
| A SECURITY | 50% | 100% | 50% | 50% | 50% | 50% | 50% |
| B ENTRY | 50% | 20% | 100% | 20% | 20% | 50% | 50% |
| C PHONE | 50% | 80% | 20% | 100% | 50% | 50% | 50% |
| D PAGER | 50% | 80% | 20% | 50% | 100% | 50% | 50% |
| E NAVIGATION | 50% | 0% | 0% | 50% | 50% | 100% | 50% |
| F RADIO | 0% | 0% | 0% | 0% | 0% | 50% | 100% | ial antenna dedicated to an individual receiver. This is one antenna-receiver relationship is not optimal when at a singular location multiple receivers must be used. For instance, in a vehicular application often a user will want to have and operate an AM/FM radio receiver, a cellular phone, a pager, a navigation receiver, a wireless remote entry system, and a security system. In some prior art systems the user would need a separate antenna for operating each receiver. This is particularly cumbersome, difficult to install, costly to vehicle manufacturers, and unsightly to vehicle users.

ADAPTIVE MULTI-RECEIVER SHARED ANTENNA MATCHING SYSTEM AND METHOD

FIELD OF THE INVENTION

This invention is generally directed to the field of antennas and radio receivers. In particular, it is useful for sharing a common antenna between multiple radio receivers.

BACKGROUND OF THE INVENTION

Contemporary radio receiver systems often have an individual antenna dedicated to an individual receiver. This is one antenna-receiver relationship is not optimal when at a singular location multiple receivers must be used. For instance, in a vehicular application often a user will want to have and operate an AM/FM radio receiver, a cellular phone, a pager, a navigation receiver, a wireless remote entry system, and a security system. In some prior art systems the user would need a separate antenna for operating each receiver. This is particularly cumbersome, difficult to install, costly to vehicle manufacturers, and unsightly to vehicle users.

Some prior art vehicular systems shared a common antenna for more than one receiver, such as in the case of an AM radio receiver, an FM radio receiver, and a CB (Citizen's Band) receiver.

In a first shared antenna design scheme, all of the receivers, AM radio, FM radio, and CB, are simultaneously connected to the singular antenna at a common electrical connection. In this scheme the antenna-to-receiver matching for the individual receivers is compromise that relies on the separate, distal, frequency ranges of the complementary receivers to achieve (for each receiver) a less than optimal antenna-to-receiver matching. Note that matching refers to an impedance balance between the antenna and the coupled receiver. So the matching aspect of the design of the shared antenna-CB receiver coupling is affected by the also-connected shared antenna-FM receiver coupling, and the shared antenna-AM radio receiver coupling.

In another shared antenna design scheme, the user has to deliberately switch (choose) between the active receiver of the group of receivers. In one prior art scheme, when the user selects a receiver, the shared, or common, antenna is switched to the selected receiver and the antenna-to-receiver matching is optimized for that coupling. A singular receiver would then be connected to, and operating on a signal received from the common antenna. This can work when you know when to invoke the receiver and exclusively for a singular antenna-receiver coupling. This approach will not work for a queued receiver, such as a cellular phone, because the user would have to anticipate when a call came in to manually switch the antenna coupling to the cellular receiver. This is also the case in the other above-mentioned queued receivers such as the pager, navigation receiver, wireless remote entry system, and security system. Since services associated with these type of queued receivers are truly interrupt, or asynchronously queued it would be hard to imaging how a user could switch these receivers to a common antenna at the appropriate time. Furthermore, since this scheme inherently only supports a singular antenna-receiver coupling only one receiver can receive at a time using the common antenna.

Neither of the prior art approaches is satisfactory as the number and functional type of receivers and associated antennas increase.

What is needed is an improved antenna-receiver system that both minimizes the number of antennas, allows autonomously queued receivers to share a common antenna, and enables multi-listen or simultaneous reception using a shared antenna.

BRIEF DESCRIPTION OF THE DRAWINGS

FIG. 1 is a system block diagram showing an adaptive multi-receiver shared antenna matching system in accordance with a preferred embodiment of the invention;

DETAILED DESCRIPTION OF THE PREFERRED EMBODIMENT

Figures 2, 4:
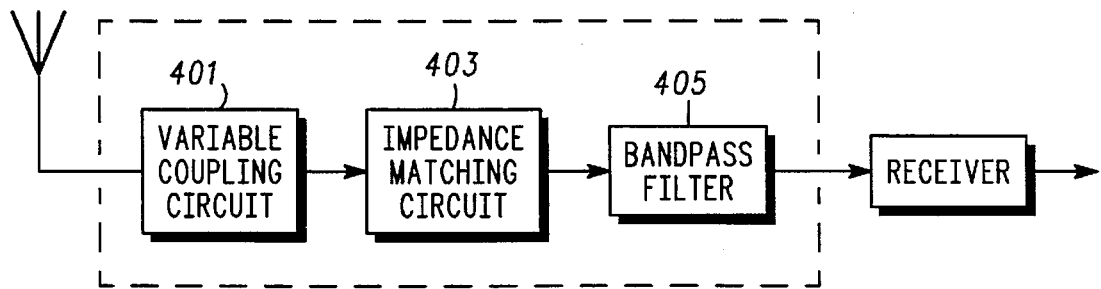
FIG. 2 is a chart showing a degree of coupling model for use with the system illustrated in FIG. 1.
FIG. 4 is a system block diagram showing further details of elements introduced in FIG. 1.

An adaptive multi-receiver shared antenna matching system and corresponding method includes an antenna. A plurality receiver devices are operably coupled to the antenna. Matching between each of the receiver devices and the antenna is dynamically alterable dependent on a degree of coupling model and signals interpreted by receivers actively connected to the antenna. This approach will work for operated selected receivers, such as those associated with an AM radio, FM radio, and CB radio, and for queued receivers, such as those associated with a cellular phone, pager, navigation device, wireless remote entry system, and security system. To understand the details of how to construct this type of system several figures will be introduced next.

FIG.. 1 is a system block diagram showing an adaptive multi-receiver shared antenna matching system in accordance with a preferred embodiment of the invention. This multi-listen system employs an antenna 101 coupled to a receiver apparatus 103 containing multiple receiver devices. An adaptive multi-receiver antenna coupling controller 131 controls a degree of coupling of each of the multiple receiver devices according to a degree of coupling model introduced later in FIG. 2. This degree of coupling is a measure of impedance matching of the receiver-antenna combination which determines which one of the receivers has coupling priority—thus most efficient signal matching.

A typical receiver device includes an impedance matching-coupling circuit 107, coupled on an input bus 105, common to the antenna 101, and a receiver 111. This receiver 111 may be any of the above-mentioned receivers. The impedance matching-coupling circuit 107 is programmed in accordance with a control signal 115 to adapt the above-mentioned degree of coupling of the receiver device 107, 111 to antenna 101 coupling, according to the earlier-mentioned degree of coupling model. The impedance matching-coupling circuit 107 provides an optimized signal 109 to the receiver 111. The receiver 111 provides a received signal 113 to a multiplexer 135 and to an external circuit which is typically an audio amplification system. The multiplexer 135 is used to monitor the output of the various receivers, of the receiver apparatus 103 containing multiple receiver devices, for control purposes as described later.

Similar to the just-described receiver device 107, 111, another receiver device 117, 119 is interconnected and is programmed in accordance with another control signal 121, and provides an output 129. This circuit 100 can be expanded to any desired number of channels as shown in FIG. 1. Next the above-referenced degree of coupling model will be detailed. Furthermore, an AM/FM receiver power control device 133 controls and interprets the power status of an AM/FM receiver, which could be any of the above-described receiver devices, in accordance with a method described later in FIG. 3.

FIG. 2 is a chart showing the degree of coupling model, represented by the table 200, for use with the system illustrated in FIG. 1. Essentially, this table 200, encoded in table form, represents a predetermined set of selectable antenna to receiver couplings intended to optimally couple the singular: antenna 101 to one or more of the receiver devices 107, 111, 117, 119 to best serve the user's expectations. In order to optimally couple the appropriate receiver device(s), the antenna must be impedance matched to the appropriate receiver device(s). Given a proper impedance match the power transfer between the antenna 101 and the appropriate receiver device(s) can be optimized. The adaptive multi-receiver antenna coupling controller 131 introduced in FIG. 1 is preferably based around a Motorola MC68HC705B5 microcontroller. The degree of coupling model, represented by the table 200, is programmed into the on-board EPROM on the microcontroller. A working example of this will be described next.

Figure 3:
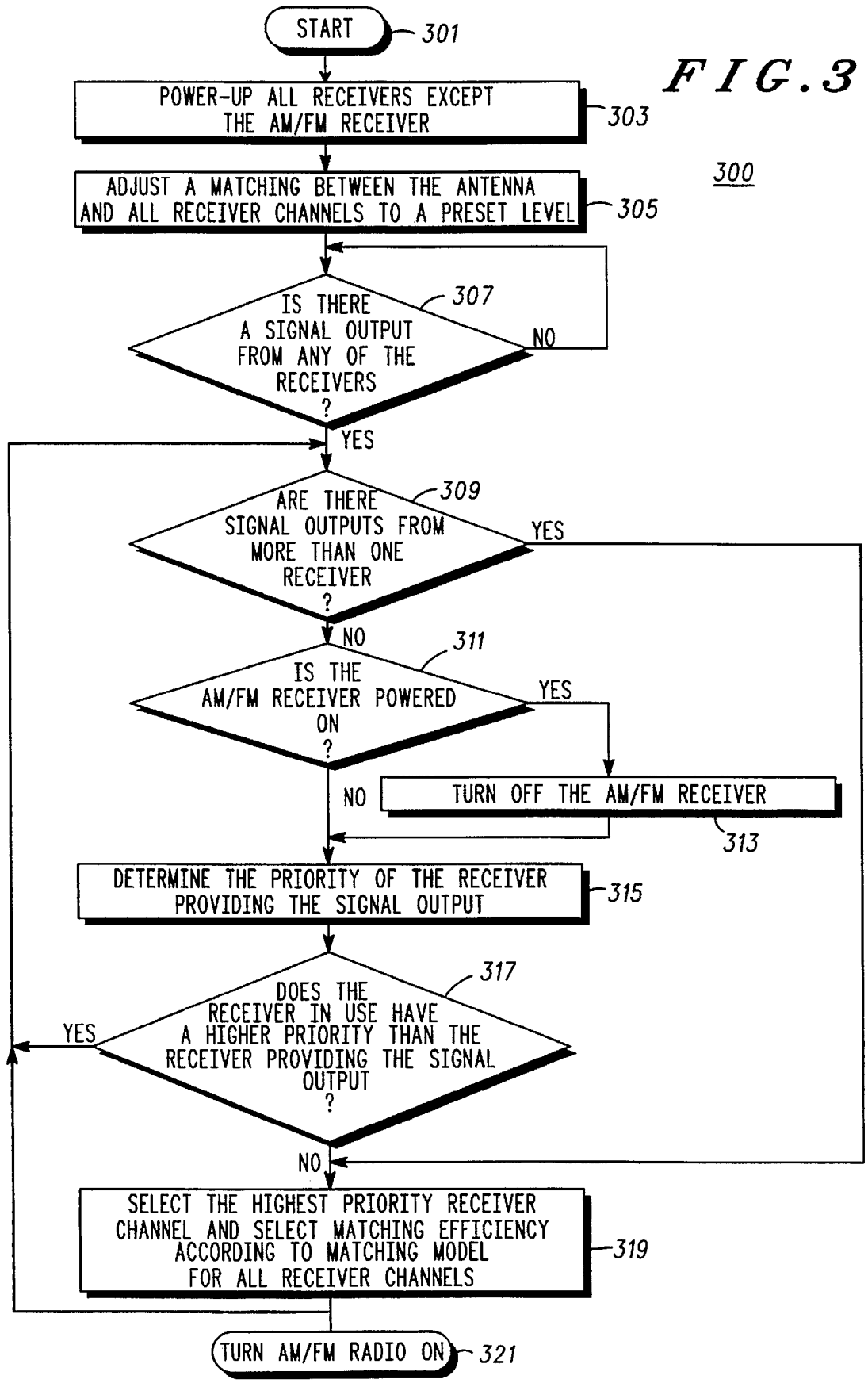
FIG. 3 is a flow chart illustrating various preferred method steps executable on the system shown in FIG. 1.

FIG. 3 is a flow chart illustrating various preferred method steps executable on the system shown in FIG. 1. The method steps are preferably encoded into the Motorola MC68HC705B5 microcontroller embedded in the adaptive multi-receiver antenna coupling controller 131. The method steps commence in the routine 300 at a start step 301 and run continuously after commencement.

In step 303 all of the queued receiver devices 111, 119 are initially powered-on. All of the non-queued receivers—such as the AM/FM receiver are initially deactivated. This action is accomplished by the adaptive multi-receiver antenna coupling controller 131 and the receiver power control circuit 133 which both activates the queued receiver devices 111, 119 and deactivates the AM/FM receiver as shown in FIG. 1.

Next, in step 305 an initial matching-coupling efficiency is selected to a preset level from the model 200. This is shown in FIG. 2 at reference number 201 as a STANDBY mode of receiver priority, where all of the queued receivers are set to 50% and the non-queued—here the RADIO is set to 0%.

Then, in step 307 signal output of the powered receivers is checked. This is accomplished by having the adaptive multi-receiver antenna coupling controller 131 interrogate output signal strength of the powered receivers via a multiplexer 135 shown in FIG. 1. The multiplexer 135 sequentially provides an output signal from each of the powered receivers to an analog-to-digital converter input of the Motorola MC68HC705B5 microcontroller indigenous to the adaptive multi-receiver antenna coupling controller 131. Step 307 iterates until there is a significant output signal strength provided by any of the powered receivers. When there is significant signal strength then step 309 is executed.

In step 309 a test is made to determine whether or not there are significant signal strengths from more than one receiver. If there are significant signal strengths from more than one receiver then the routine branches to step 319 where the degree of coupling is selected to match the highest priority receiver channel. In contrast, if there are not significant signal strengths from more than one receiver then step 311 is executed.

In step 311 the Motorola MC68HC705B5 microcontroller indigenous to the adaptive multi-receiver antenna coupling controller 131 with the aid of the receiver power control circuit 133 tests to see whether or not the AM/FM receiver is actively powered. If the AM/FM receiver is actively powered, then it is turned-off in step 313. If the AM/FM receiver is not actively powered, then step 315 is executed.

In step 315 a priority of the receiver providing the output signal is determined. The Motorola MC68HC705B5 microcontroller determines this by interrogating the output signal strengths of the receivers 111, 119 etc. and comparing them to the priority assigned in the chart shown in FIG. 2. Note that for different applications the subject chart may have different degrees of coupling and priorities.

Next, in step 317 a determination is made as to whether or not the receiver in use (providing the output signal) has a higher priority than the receiver providing the signal output. If the receiver in use (providing the output signal) has a higher priority, as determined by the chart shown in FIG. 2, than the receiver providing the signal output, then the routine 300 iterates starting at step 309. Otherwise, step 319 is executed.

In step 319 the matching of all receiver channels is adapted in accordance with the model 200 shown in FIG. 2, and the routine 300 iterates starting at step 309. Note that if the AM/FM radio is activated it is sensed in step 321 which enters the routine 300 at step 309.

FIG. 4 is a system block diagram showing further details of elements introduced in FIG. 1. Each of the impedance matching-coupling circuits 107, 117 shown in FIG. 1 can be further described using a separate variable coupling circuit 401 coupled to an impedance matching circuit 403, coupled to a bandpass filter circuit 405. Optimally, each of these circuits 401, 403, and 405 are programmable dependent on a model—similar to the one described earlier.

In conclusion, an improved antenna-receiver system and method that both minimizes the number of antennas and allows autonomously queued invocation of antenna to receiver coupling. This approach allows connection and dynamically alterable of matching of multiple receivers to a shared antenna. This allows for multi-listen or simultaneous reception using the shared antenna. Beneficially, the number of antennas in a multi-receiver application can be reduced while the added function of receiver prioritizing can be realized.

What is claimed is:

1. An adaptive multi-receiver shared antenna matching system comprising:

an antenna;

a plurality of receivers each operably coupled to the antenna, wherein a degree of coupling between each of the receivers and the antenna is alterable dependent on a plurality of degree of coupling signals each associated with a different one of the plurality of receivers;

a degree of coupling model; and a degree of coupling controller for providing each of the plurality of degree of coupling signals, wherein the degree of coupling controller provides each of the plurality of degree of coupling signals in accordance with the degree of coupling model.

2. A system in accordance with claim 1 further comprising:

a measurement circuit for determining an output signal associated with a receiver of the plurality of receivers; and wherein the degree of coupling controller provides each of the plurality of degree of coupling signals in accordance with the degree of coupling model dependent on the determined output signal.

3. A system in accordance with claim 1 wherein each of the plurality of degree of coupling signals causes a different degree of coupling between each of the receivers and the antenna.

4. A system in accordance with claim 1 wherein each of the plurality of receivers comprises:

a variable coupling circuit for providing a coupled antenna signal dependent on a signal received from the antenna;

a impedance matching circuit coupled to and for receiving the coupled antenna signal from the variable coupling circuit, and for providing an impedance-matched-coupled antenna signal dependent on the coupled antenna signal;

a bandpass filter coupled to and for receiving the impedance-matched-coupled antenna signal from the impedance matching circuit and for providing a bandpass-filtered-impedance matched-coupled antenna signal dependent thereon; and a receiver coupled to the bandpass filter for providing a received signal dependent on the bandpass-filtered-impedance matched-coupled antenna signal.

5. An adaptive multi-receiver antenna matching method comprising the steps of:

providing an antenna;

operably coupling a plurality of receivers to the antenna, wherein a degree of coupling between each of the receivers and the antenna is alterable dependent on a plurality of degree of coupling signals each associated with a different one of the plurality of receivers;

providing a degree of coupling model; and providing each of the plurality of degree of coupling signals in accordance with the provided degree of coupling model.

6. A method in accordance with claim 5 further comprising a step of:

determining an output signal associated with a receiver of the plurality of receivers; and wherein the step of providing each of the plurality of degree of coupling signals provides each of the plurality of degree of coupling signals in accordance with the provided degree of coupling model dependent on the step of determining an output signal.

7. An adaptive multi-receiver shared antenna matching system comprising:

an antenna;

a plurality of receivers each comprising, a) a variable coupling circuit for providing a coupled antenna signal dependent on a signal received from the antenna, and a degree of coupling signal;

b) an impedance matching circuit coupled to and for receiving the coupled antenna signal from the variable coupling circuit, and for providing an impedance matched-coupled antenna signal dependent on the coupled antenna signal;

c) a bandpass filter coupled to and for receiving the impedance-matched-coupled antenna signal from the impedance matching circuit and for providing a bandpass filtered-impedance-matched coupled antenna signal dependent thereon;

d) a receiver coupled to the bandpass filter for providing a received signal dependent on the bandpass filtered-impedance-matched-coupled antenna signal;

a degree of coupling model; and a degree of coupling controller for providing a degree of coupling signal for each of the plurality of receivers in accordance with the degree of coupling model, wherein a degree of coupling between each of the impedance matching circuits and the antenna is alterable dependent on the degree of coupling signal.

8. A system in accordance with claim 7 further comprising:

a degree of coupling model; and wherein the degree of coupling controller provides each of the plurality of degree of coupling signals in accordance with the degree of coupling model.

9. A system in accordance with claim 8 further comprising:

a measurement circuit for determining an output signal associated with a receiver of the plurality of receivers; and wherein the degree of coupling controller provides each of the plurality of degree of coupling signals in accordance with the degree of coupling model dependent on the determined output signal.

10. A system in accordance with claim 9 wherein each of the plurality of degree of coupling signals causes a different degree of coupling between each of the receivers and the antenna.

11. A system in accordance with claim 7 further comprising:

a measurement circuit for determining an output signal associated with a receiver of the plurality of receivers; and wherein the degree of coupling controller provides each of the plurality of degree of coupling signals dependent on the determined output signal.

* * * * *